(12) United States Patent
Mendiratta

(10) Patent No.: US 9,793,188 B2
(45) Date of Patent: Oct. 17, 2017

(54) COMPOSITIONS AND METHODS FOR SEMICONDUCTOR PROCESSING AND DEVICES FORMED THEREFROM

(71) Applicant: Equity Solar, Inc., Greenbrae, CA (US)

(72) Inventor: Arjun Mendiratta, Oakland, CA (US)

(*) Notice: Subject to any disclaimer, the term of this patent is extended or adjusted under 35 U.S.C. 154(b) by 0 days.

(21) Appl. No.: 14/801,881

(22) Filed: Jul. 17, 2015

(65) Prior Publication Data

US 2016/0181172 A1 Jun. 23, 2016

Related U.S. Application Data

(60) Provisional application No. 62/026,282, filed on Jul. 18, 2014.

(51) Int. Cl.
*H01L 23/29* (2006.01)
*H01L 23/31* (2006.01)
*C09K 13/08* (2006.01)
*H01L 31/0216* (2014.01)

(52) U.S. Cl.
CPC ........... *H01L 23/291* (2013.01); *C09K 13/08* (2013.01); *H01L 23/3171* (2013.01); *H01L 31/02167* (2013.01); *H01L 2924/0002* (2013.01); *Y02E 10/50* (2013.01)

(58) Field of Classification Search
CPC . H01L 23/291; H01L 23/3171; H01L 21/563; H01L 21/02052; H01L 21/67051; H01L 21/02024; H01L 21/30604; H01L 21/32115; H01L 21/3212; H01L 21/7684; C09K 13/08; C09K 3/1463; C04B 41/009; C04B 35/10; C04B 41/5346; C04B 41/91; C25F 3/12
USPC ........................................................ 438/127
See application file for complete search history.

(56) References Cited

FOREIGN PATENT DOCUMENTS

KR 20030053138 * 6/2003

* cited by examiner

*Primary Examiner* — Caleen Sullivan
(74) *Attorney, Agent, or Firm* — McDonald Hopkins, LLC; Joseph J. Crimaldi, Esq.

(57) ABSTRACT

The present invention relates generally to the field of semiconductor devices, including solar cells, and compositions and methods for processing semiconductor devices, passivation of semiconductor surfaces, semiconductor etching and anti-reflective coatings for semiconductor devices.

15 Claims, 6 Drawing Sheets

| Oxidant | Film Growth? (By color change on Si surface) |
|---|---|
| $(NH_4)(S_2O_8)$ | Negative |
| $H_2O_2$ | Negative |
| $KBrO_3$ | Negative —— 410 |
| | Negative —— 420 |
| | Upon KI addition, solution turns red then yellow. Very rapid etch (300 Ω/sq in 80 sec), but no evidence of film growth |
| $HIO_3$ | Baseline |
| $(NH_4)(ClO_4)$ | Negative |
| $KClO_3$ | Negative |
| | Negative |
| | Negative |
| $H_2SeO_3$ | Rapid etch (~1 Ω/sec) and color changes corresponding to film growth. Highly non-uniform appearance. Bubbies appearance |
| | Turns yellow. Slightly slower etch and more uniform appearance |

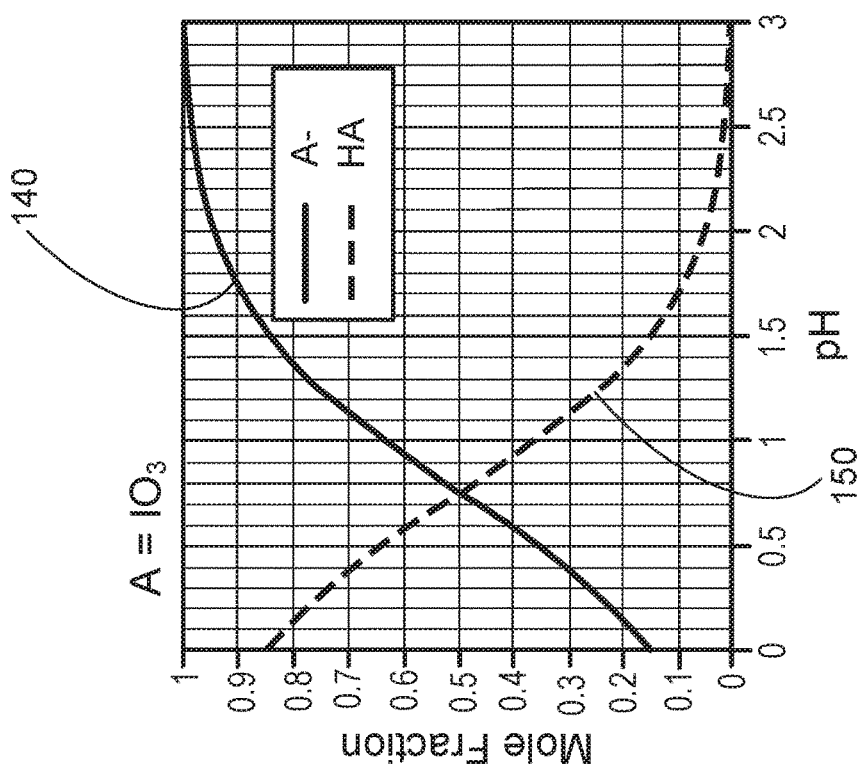
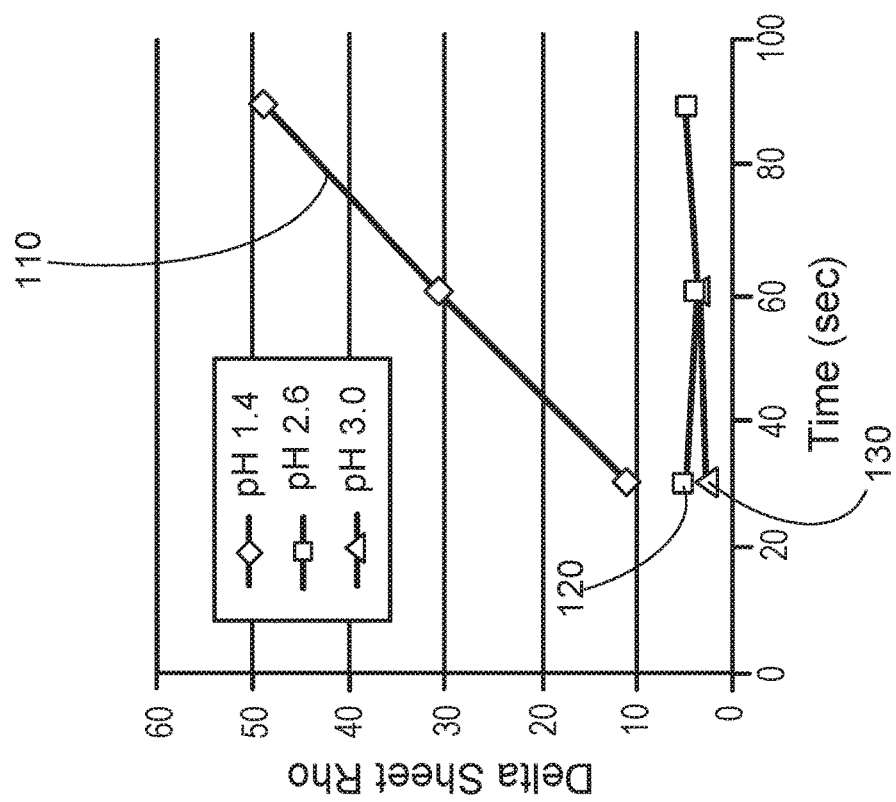
FIG. 1B
FIG. 1A

| Oxidant | Film Growth? (By color change on Si surface) |
|---|---|
| $(NH_4)(S_2O_8)$ | Negative |
| $H_2O_2$ | Negative |
| $KBrO_3$ | Negative —— 410<br>Negative —— 420<br>Upon KI addition, solution turns red then yellow<br>Very rapid etch (300 Ω/sq in 80 sec), but no evidence of film growth |
| $HIO_3$ | Baseline |
| $(NH_4)(ClO_4)$ | Negative |
| $KClO_3$ | Negative<br>Negative<br>Negative |
| $H_2SeO_3$ | Rapid etch (~1 Ω/sec) and color changes corresponding to film growth. Highly non-uniform appearance. Bubbles appearance<br>Turns yellow. Slightly slower etch and more uniform appearance |

FIG. 4

COMPOSITIONS AND METHODS FOR SEMICONDUCTOR PROCESSING AND DEVICES FORMED THEREFROM

CROSS-REFERENCES TO RELATED APPLICATIONS

The present application claims the benefit, under 35 U.S.C. §119(e), of U.S. Provisional Application Ser. No. 62/026,282, filed Jul. 18, 2014, entitled "Compositions and Methods for Semiconductor Processing and Devices Formed Therefrom," the entire contents of which is hereby incorporated by reference herein.

BACKGROUND

The present invention relates generally to the field of semiconductor devices, including solar cells, and compositions and methods for processing semiconductor devices, passivation of semiconductor surfaces, semiconductor etching and anti-reflective coatings for semiconductor devices.

SUMMARY

In one embodiment, the present invention provides a composition for treating a semiconductor surface, wherein the composition comprises (a) an oxidant, (b) a compound comprising fluorine, (c) one or more additives, and (d) water. In some embodiments, the composition comprises A wt % of said oxidant, B wt % of said compound comprising fluorine, C wt % of said one or more additives, and D wt % water, wherein the sum of A, B, C, and D is about 100. In certain embodiments, the oxidant comprises one or more halogens and/or chalcogens. In some embodiments, the oxidant comprises one or more of oxygen, sulfur, selenium, or tellurium. In some embodiments, the oxidant is $H_2SeO_3$. In other embodiments, the oxidant comprises one or more of fluorine, chlorine, or bromine. In some embodiments, the oxidant is selected from chloric acid and bromic acid. In some embodiments, the oxidant is an oxyacid having the empirical formula $H_aR_bO_c$. In certain embodiments, R is a halogen or a chalcogen. In some embodiments, a is 1, 2, 3 or 4. In other embodiments, b is 1, 2 or 3. In some embodiments, c is 1, 2, 3, 4, 5, 6, 7 or 8. In some embodiments, the oxidant is an oxyacid having the empirical formula $HRO_3$ or $H_2RO_3$. In some embodiments, the oxidant is an oxyacid having a trigonal pyramidal molecular geometry. In certain embodiments, A is from about 0.01 wt % to about 1 wt %. In some embodiments, B is from about 0.1 wt % to about 10 wt %. In other embodiments, C is from about 1 wt % to about 50 wt %. In some embodiments, the compound comprising fluorine comprises one or more of HF, $H_2SiF_6$, $NH_4F$, $H_2TiF_6$, BaF, $BF_4$, NaF, metal fluorides and non-metal fluorides. In some embodiments, the compound comprising fluorine is HF. In certain embodiments, the compound comprising fluorine is $NH_4F$. In some embodiments, the one or more additives comprise one or more of HF, HCl, HBr, HI, $H_3PO4$ and $NH_4OH$. In certain embodiments, the one or more additives is $NH_4OH$. In some embodiments, the ratio of B to C is from about 4:1 to about 1:20. In one embodiment, the oxidant is $H_2SeO_3$ which is present in an amount of from about 0.01 g/L to about 1 g/L.

In another embodiment, the present invention provides a dilute aqueous solution comprising a composition as described herein, and water. In certain embodiments, the dilute aqueous solution comprises a composition as described herein and water in a ratio of from about 1:4 to about 1:10.

In another embodiment, the present invention provides a semiconductor device comprising at least one passivated oxide layer, wherein said passivated oxide layer is formed by treating said semiconductor device with a composition or dilute aqueous solution as described herein. In some embodiments, the semiconductor device comprises a passivated oxide layer having a thickness of from about 40 Å to about 200 Å. In some embodiments, the semiconductor device exhibits a sheet rho after forming said passivated oxide layer of from about 50 to about 120 ohm/sq. In certain embodiments, the semiconductor device exhibits a sheet rho after forming said passivated oxide layer of from about 60 to about 90 ohm/sq. In other embodiments, the semiconductor device exhibits a sheet rho delta after forming said passivated oxide layer of from about 3 to 20 ohm/sq. In some embodiments, the semiconductor device exhibits a sheet rho delta after forming said passivated oxide layer of from about 9 to 15 ohm/sq. In one embodiment, the semiconductor device exhibits a sheet rho delta after forming said passivated oxide layer of about 10 ohm/sq.

In another embodiment, the semiconductor device comprising at least one passivated oxide layer exhibits a reflectance minimum at a wavelength greater than a substantially similar semiconductor device which does not comprise a passivated oxide layer. In certain embodiments, the wavelength of light incident on the surface of the semiconductor device is red-shifted by from about 20 nm to about 45 nm.

In another embodiment, the present invention provides a method of growing an oxide layer on a semiconductor device, the method comprising comprises contacting at least one surface of a semiconductor device with a composition or dilute aqueous solution as described herein. In some embodiments, contacting is conducted for a time of from about 3 sec to about 1000 sec. In certain embodiments, the oxide layer has a thickness of from about 40 Å to about 200 Å.

In another embodiment, the present invention provides a method of making the compositions described herein, comprising admixing: (a) an oxidant, (b) a compound comprising fluorine, (c) one or more additives, and (d) water. In certain embodiments of a method of making the compositions described herein, the composition comprises A wt % of said oxidant, B wt % of said compound comprising fluorine, C wt % of one or more additives, and D wt % water, wherein the sum of sum of A, B, C, and D is about 100. In some embodiments, A is from about 0.01 wt % to about 1.0 wt %. In other embodiments, B is from about 0.1 wt % to about 10 wt %. In some embodiments, C is from about 1 wt % to about 50 wt %. In one embodiment, B is less than 10. In other embodiments, B is less than 7.

In another embodiment, the present invention provides a method of preparing a dilute aqueous solution as described herein, comprising admixing a composition as described herein with water. In some embodiments the ratio of the composition to water is from about 1:4 to about 1:10.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A is a plot of the change in sheet resistance of a surface of silicon as a function of time due to the growth of an oxide layer on the surface of the silicon wafer for different acidity levels of the composition used to treat the surface.

FIG. 1B is a plot of the amount of iodic acid left in its acidic and deprotonated forms in a composition used to treat semiconductor surfaces as the acidity of the composition decreases.

FIG. 4 is a table of oxidants that can be used in compositions to etch the surface of a silicon wafer, and the effects of the oxidants in growth of an oxide film on the surface, as detected by color change of the surface.

DETAILED DESCRIPTION

Figure 2:
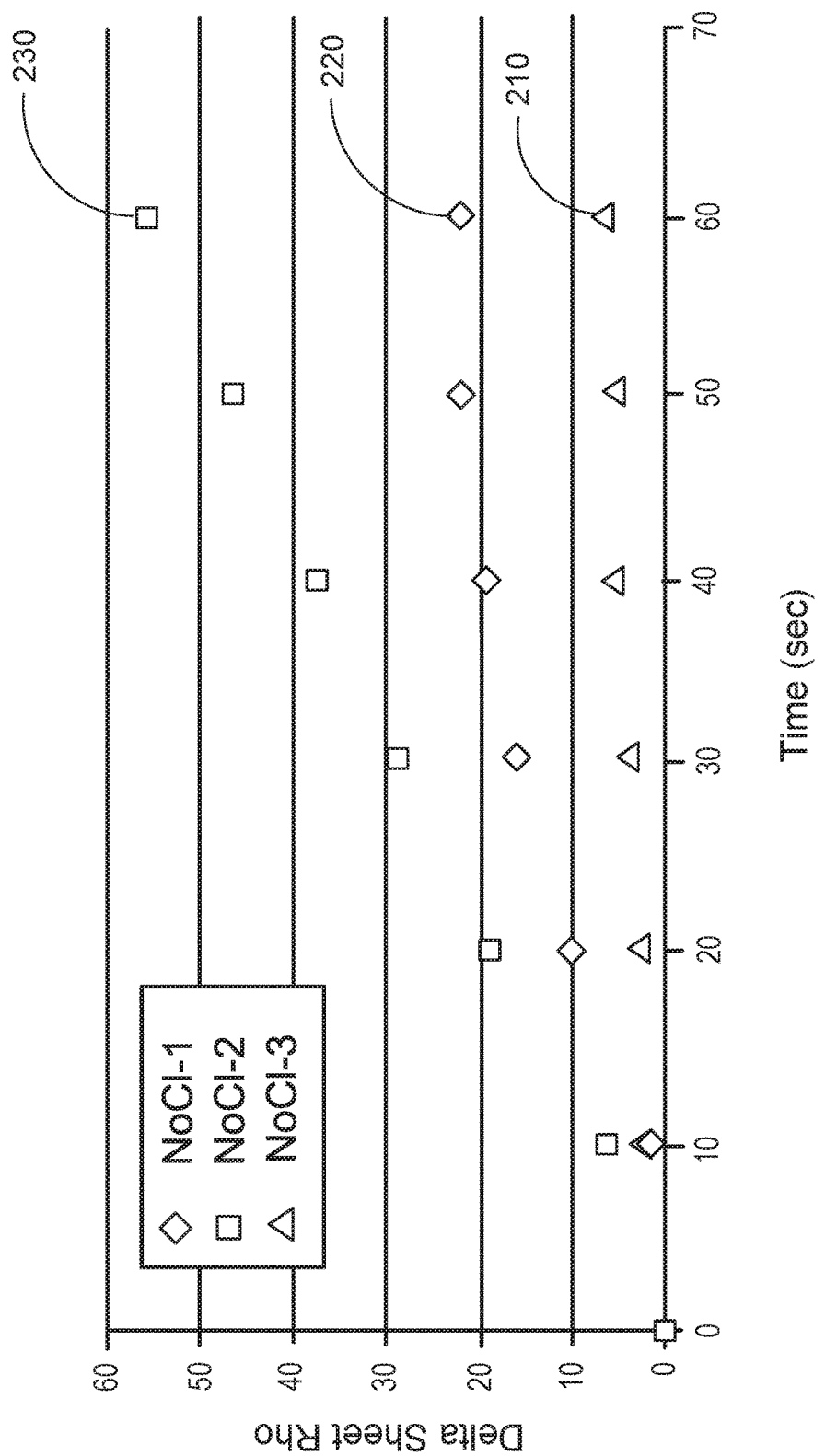
FIG. 2 is a plot of the change in sheet resistance of a surface of silicon as a function of time for different concentrations of the oxidizing agent iodic acid in the composition used to treat the surface. In all three experiments, the composition includes no hydrochloric acid.

The present invention discloses provides compositions for treating the semiconductor devices to obtain certain desired properties. For example, in etching silicon (Si) wafers to obtain a certain surface texture, a composition comprising an oxidant, and an acid or base to remove the oxidized surface may be used. In some embodiments, the composition may also include a buffering agent and/or a diluent. The buffering agent may be used to control the acidity of the composition and further replenish ions that are used up in the etching process, thereby contributing to the maintenance of a stable etching rate. The diluent may be used to transport out products of the surface treatment process and other excess reactants. The performance of the composition may be measured by, for example, the change in the sheet resistance rho ($\Delta\rho$) of the surface of the semiconductor device being treated by the composition.

FIG. 1A shows an exemplary plot of $\Delta\rho$ of a semiconductor device comprising silicon wafer due to the growth of passivated oxide layer on surfaces of the device for different pH levels of the composition used to treat the device. In some embodiments of the present invention herein, the composition used to etch the semiconductor surface comprises iodic acid ($HIO_3$) as the oxidant. For example, for the device comprising silicon, iodic acid may interact with silicon to produce silicon dioxide ($SiO_2$) as shown in the following chemical reaction:

$$Si + 4HIO_3 \rightarrow SiO_2 + 4IO_2 + 2H_2O.$$

The efficiency of the above chemical reaction depends on the acidity of the composition and/or the concentration of iodic acid in the composition. For example, iodic acid is a stronger oxidant in an acidic solution as opposed to a basic one. In some embodiments, hydrocholoric acid (HCl) may be used to regulate the pH level of the composition. The oxidizing ability of the composition may also depend on how strongly iodic acid dissociates in a solution, a property that can be quantitatively measured by the acid dissociation constant $K_a$, or more commonly by the logarithm of the acid dissociation constant $pK_a$. The $pK_a$ of iodic acid (i.e., half the amount of the iodic acid has dissociated into the conjugate base $IO_3^-$ and hydrogen ions $H^+$) is 0.75, indicating an acid that dissociates strongly and may not be as effective of an oxidant in a composition with a higher pH value. For example, as shown in FIG. 1B, iodic acid deprotonates (dissociate into $H^+$ and $IO_3^-$) rather rapidly as the acidity of the solution decreases (although remaining acidic). For example, the concentration 140 of the deprotonated form of iodic acid ($IO_3^-$) reaches about 99% while the composition itself has a strong acidity level of pH about 2.6, whereas the concentration 150 of the acidic form ($HIO_3$) falls to about 1%. At this level of iodic acid concentration, the composition may lose its oxidizing capacity to a large extent, as can be seen in FIG. 1A. For example, the change in the sheet resistance 110 of a silicon wafer etched with a composition comprising iodic acid and at a pH level of about 1.4 is significant, with the exemplary embodiment in FIG. 1A showing an increase of about 40Ω in about a minute. This corresponds to the growth of a film of oxide layer (e.g., $SiO_2$) on the surface of the wafer. When the pH of the composition increases to 2.6 and further to 3, corresponding to a decreasing concentration of $HIO_3$, the changes in the sheet resistance 120 and 130 hardly change over a course of a minute indicating that $SiO_2$ was not being formed on the wafer surface.

In the exemplary embodiments shown in FIG. 1, the composition used to treat the surface of the semiconductor device comprises nitric acid ($HNO_3$) as an oxidant and hydrofluoric acid (HF) as an agent capable of etching the oxidized surface. For example, the oxidation of a silicon surface by an acid such as iodic acid may result in $SiO_2$ forming on the surface of the wafer. To texture or pattern the surface, in some embodiments, a dissolving agent such as hydrofluoric acid (HF) may be used. For example, HF may dissolve a layer of $SiO_2$ formed on a silicon layer as shown in the following chemical reaction:

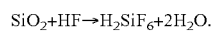

$$SiO_2 + HF \rightarrow H_2SiF_6 + 2H_2O.$$

In some embodiments, additional additives (e.g., non-oxidizing acids or bases) may be included in the composition used to treat the wafer surface. For example, ammonium fluoride ($NH_4F$) may be used as a buffering agent to control the pH of the composition and serve as source of additional fluoride ions. In addition, diluents such as acetic acid and/or water may be used as medium to transport reactants/by-products out of the silicon surface. This results in a more stable and controllable etching rate.

FIG. 2 shows exemplary plots of $\Delta\rho$ as a function of time for different concentrations of iodic acid in the composition used to treat the semiconductor device. The compositions used in the exemplary embodiments of FIG. 2 comprise iodic acid as an oxidant and HF as a dissolving agent. Furthermore, the composition does not comprise hydrochloric acid (HCl), and yet all the plots show growth of surface oxide over time as measured by $\Delta\rho$. In some embodiments, the rate of growth depends on the concentration of the oxidizing agent, with higher concentrations resulting in faster growth. For example, for composition 230 comprising iodic acid, the rate of surface oxide growth is about six times that of a composition 210 with a lower iodic acid concentration. Nevertheless, all three plots 210, 220 and 230 with $HIO_3$ at varying concentrations exhibit surface oxide growth, indicating that HCl is not needed in the etching composition to allow the formation of oxide layer on the semiconductor surface.

Figure 3A:
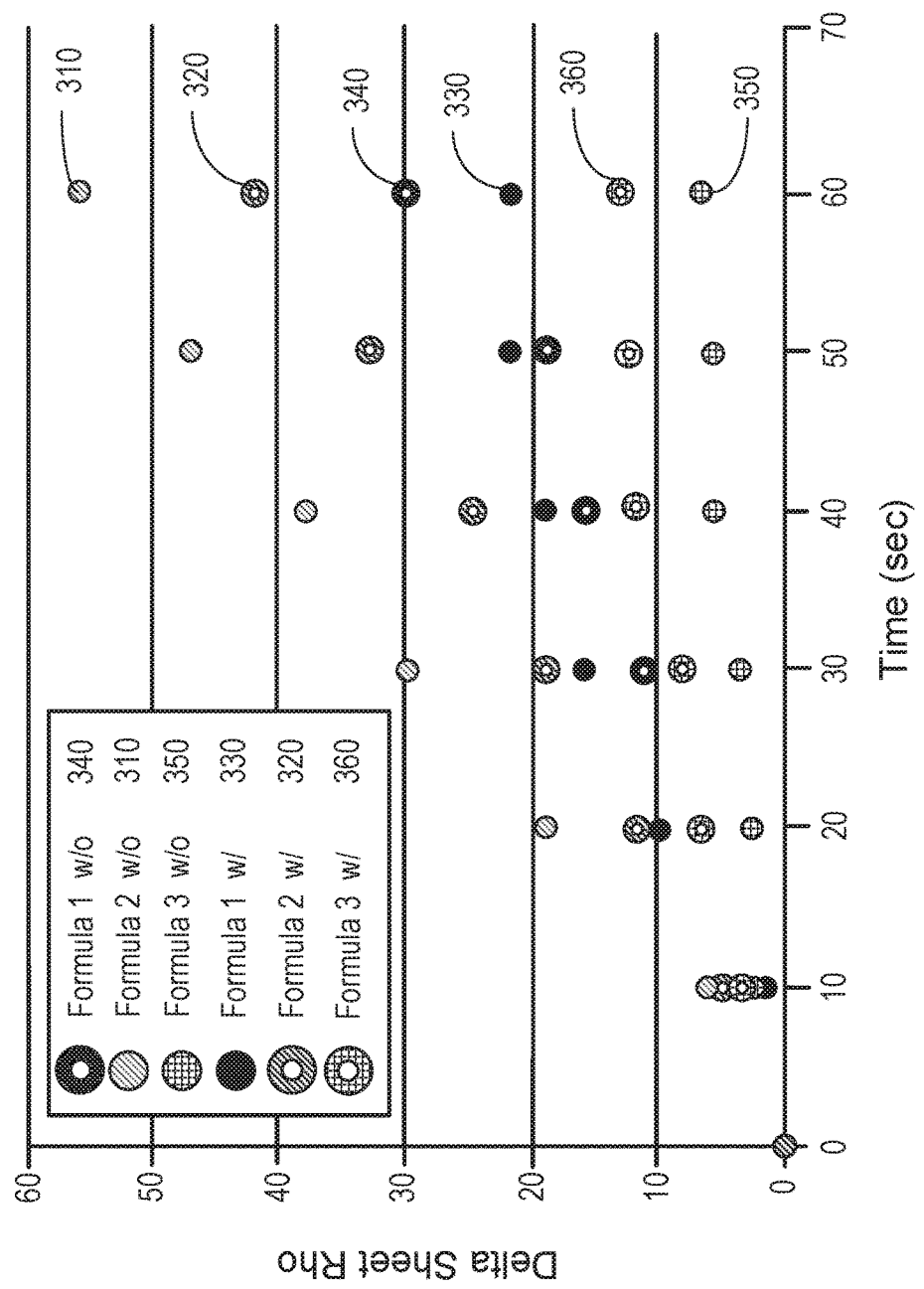
FIG. 3A is a plot showing the effect of sulfuric acid on the change in sheet resistance of a surface of silicon as a function of time for different concentrations of the oxidizing agent iodic acid in the composition used to treat the surface.
Figure 3B:
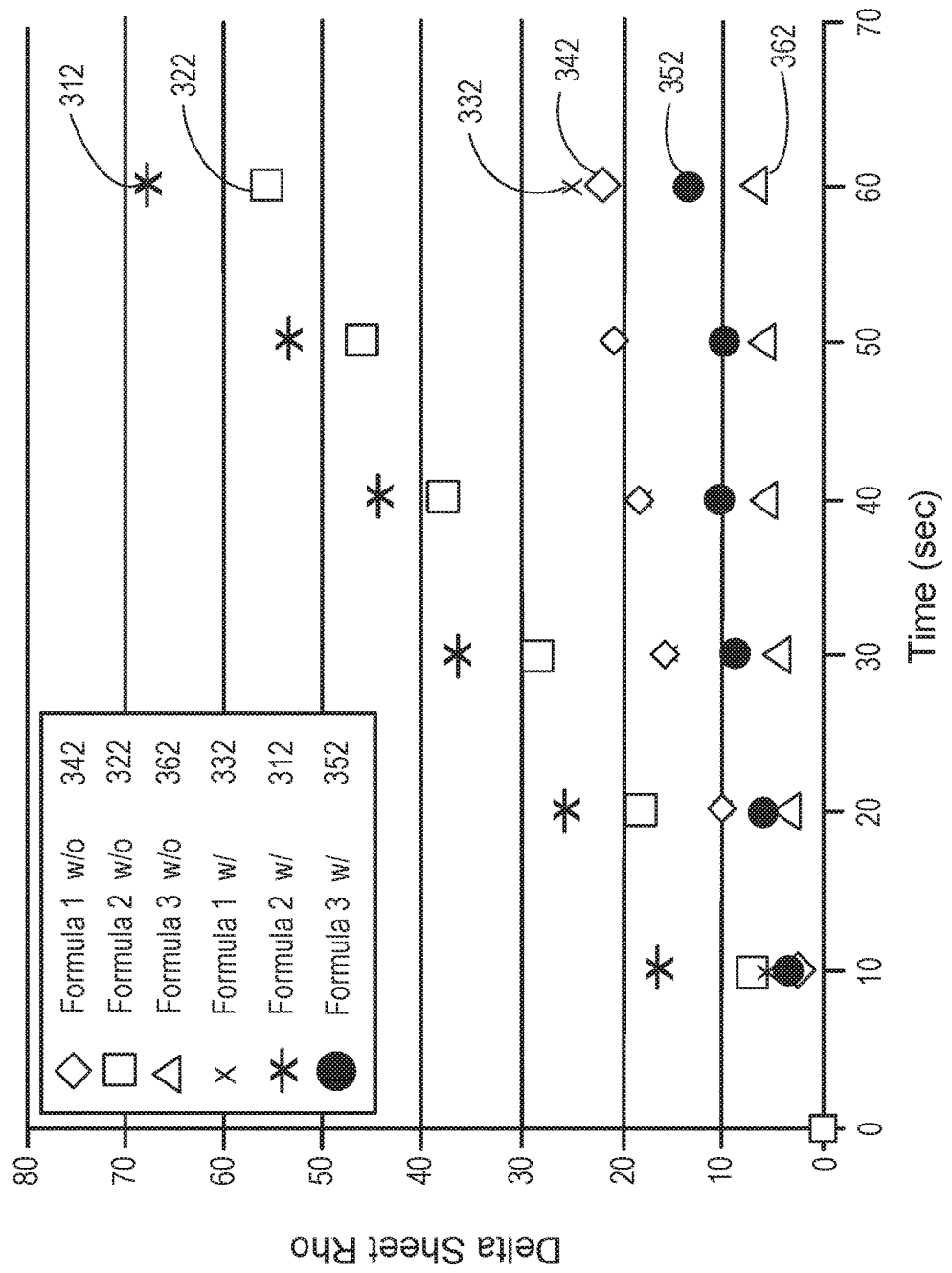
FIG. 3B is a plot showing the effect of nitric acid on the change in sheet resistance of a surface of silicon as a function of time for different concentrations of the oxidizing agent iodic acid in the composition used to treat the surface.

In some embodiments, it may be desirous to use other types of acids in etching compositions instead of, or in conjunction with, HCl. Examples of other acids that may be used in an etching composition are sulfuric acid ($H_2SO_4$), nitric acid, or other mineral acids. The effect of some of the acids on the growth of oxide layers on semiconductor surfaces may depend on the concentration of the oxidant in the composition. For example, FIG. 3A illustrates surface layer growth as measured by $\Delta\rho$ when the etching composition comprises $H_2SO_4$ and the oxidant is iodic acid. For low concentrations of the oxidant $HIO_3$, the presence of sulfuric acid in the composition increases the growth rate of oxide formation on the semiconductor surface as can be seen by the higher value of $\Delta\rho$ 360 compared to that of $\Delta\rho$ 350 where the surface was treated with a composition without sulfuric acid. However, as the concentration of the oxidant $HIO_3$ increases, the addition of sulfuric acid into the composition starts to exhibit the opposite effect, reducing the sheet resistance $\Delta\rho$ 340 compared to $\Delta\rho$ 330 for the majority of the etching duration when there is no $H_2SO_4$ in the composition. When the oxidant $HIO_3$ concentration is increased, in some embodiments, the effect of $H_2SO_4$ in a composition used to treat semiconductor surfaces is to retard the growth rate of oxide formation on the surface, as can be inferred from the lower values of $\Delta\rho$ 320 where the composition comprises $H_2SO_4$ compared to that of $\Delta\rho$ 310 where the amount of sulfuric acid in the composition is about zero.

In contrast, in some embodiments, the effect of adding nitric acid in an etching composition for treating semiconductor surfaces remains qualitatively similar for concentrations of the oxidant $HIO_3$. For example, the change in the sheet resistances $\Delta\rho$ 322, 342 and 362 of a semiconductor device treated with a compositions comprising $HIO_3$, when the composition comprises little or no $HNO_3$, are lower than $\Delta\rho$ 312, 332 and 352, respectively, for about same levels of $HIO_3$ concentration in compositions comprising nitric acid.

FIG. 4 shows a list of exemplary compounds that are candidates for use as oxidants in a composition to treat surfaces of semiconductor device. Using the color change that occurs on the treated surfaces of the semiconductor device when the composition comprises iodic acid as a benchmark for film growth, in some embodiments, oxidants such as ammonium peroxide sulfate (($NH_4)S_2O_8$), hydrogen peroxide ($H_2O_2$), potassium bromate ($KBrO_3$), ammonium chlorate (($NH_4)ClO_4$), and potassium chlorate ($KClO_3$) fail to result in the formation oxide layers on the surfaces. In some embodiments, the amount of oxidants added into the composition may not have appreciable affect on whether film growth takes place or not. For example, film growth on surfaces of silicon, as determined based on color change of the surfaces, remains nearly or completely non-existent when the amount of $KBrO_3$ in the composition 420 is ten times than the one in an initial composition 410 that also failed to result in film growth. The addition of potassium iodide in an amount about same as the amount of $KBrO_3$ used in a same composition may result in a very rapid etching but still no film growth. For example, a composition comprising 860 mg of $KBrO_3$ as oxidant, 25 mL of HF (49% in water concentration) as an additive, and 86 mg of KI as an additive may result in 300 $\Omega$/sq of sheet resistance in about 80 s. However, despite the very fast etching rate, there is very little or no film growth on the surfaces of the semiconductor device. Similarly, in some embodiments, the use of different amounts of $KClO_3$ and addition of KI in the composition comprising $KClO_3$ and used to treat semiconductor surfaces may not lead to appreciable amount of film growth on the surfaces.

Applicants have appreciated that some of the components of the composition utilized in treating surfaces of semiconductor devices such as but not limited to silicon may not be desirable for various reasons. For example, HF is known for being a very dangerous material. It is capable of penetrating skin and attacking flesh and bones even in its diluted form, while a victim may not feel any indication until it is too late due to HF's weak acidity in the dilute state. Similarly, it may be desirable to use other acids in the compositions instead of, or perhaps along with, HCl. For example, one may wish to control the acidity of the compositions (for example, change the pH level) for different reasons. For example, some oxidants, such as but not limited to iodic acid, are better oxidants in an acidic environment, and keeping the acidity of the composition from deteriorating (i.e., keeping the pH level low) may help with preventing the degradation of the oxidants' performance when treating semiconductor devices. Applicants have appreciated the need to accommodate these priorities, and have discovered components for compositions to treat semiconductor surfaces whose performances are not degraded when the pH level is increased, and result in oxide film growth on the surfaces.

Figures 5A, 5B:
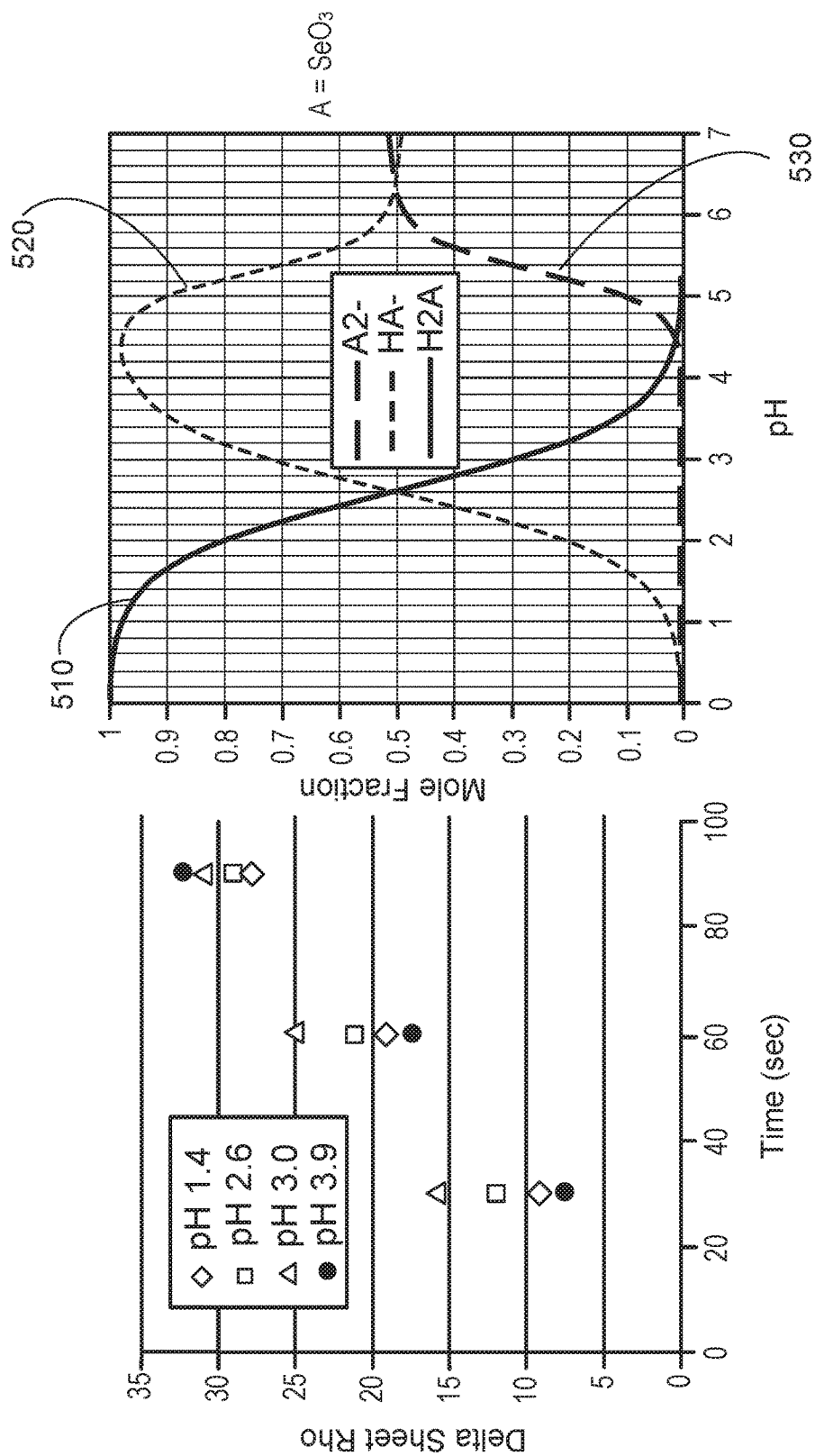
FIG. 5A is a plot showing the change in sheet resistance of a surface of silicon as a function of time for composition or varying acidity used to treat a surface, with selenous acid as the oxidizing agent in the composition.
FIG. 5B is a plot showing of the pKa values for selenous acid in compositions used to treat semiconductor surfaces.

FIG. 5 illustrates one such inventive embodiment of a composition comprising selenous acid ($H_2SeO_3$) as an oxidant, HF as an oxide dissolving agent, and water as a diluent wherein the composition was used to treat surfaces of silicon wafers. In contrast to the performance of a $HIO_3$ (FIG. 1A), $H_2SeO_3$ remains effective as an oxidant even when the composition used to treat the surfaces becomes less acidic. For example, FIG. 5A shows that the sheet resistance $\Delta\rho$ of a silicon surface increases over time when it is treated with a composition comprising $H_2SeO_3$ even when the pH of the composition is about 2.6, which is markedly different from the case of a composition comprising $HIO_3$ and may indicate the formation of passivated oxides on the silicon surfaces. In some embodiments, $H_2SeO_3$ is effective as an oxidant in compositions whose pH values are even greater than 2.6. For example, FIG. 5A shows $H_2SeO_3$ is effective as an oxidant, as shown by the increasing values of $\Delta\rho$ over time when treating silicon surfaces, in compositions whose pH values are as high as about 3.9. Some of the explanation for this effect may be seen in FIG. 5B, where the amount 510 of selenous acid (in its acidic form $H_2SeO_3$) in a composition whose pH value is about 3.9 (in fact as high as 5) is seen to be finite. Furthermore, selenous acid in its singly-deprotonated form ($HSeO_3^-$) may also be effective as an oxidant.

This follows from the fact that while the amount 510 of $H_2SeO_3$ in its acidic form decreases with $H_2SeO_3$ converting into the singly-deprotonated ($HSeO_3^-$) form, thereby increasing the amount 520 the $HSeO_3^-$ in the composition, FIG. 5A shows that oxidation takes place on the surfaces of a semiconductor device treated by the composition (e.g., for compositions with pH values of about 3.9 and less). The acidity of the composition approaches neutrality as the singly deprotonated form starts converting into the doubly-deprotonated 530 form $SeO_3^{2-}$.

In some embodiments, the composition used to treat semiconductor surfaces may comprise different proportions of oxidants, compounds, additives, and diluent (e.g., water). For example, the composition may comprise A wt % of an oxidant, B wt % of a compound comprising fluorine, C wt % of one or more additives, and D wt % water, wherein the sum of A, B, C, and D is about 100. In some embodiments, A ranges from about 0.01 to about 1; B ranges from about 0.1 to about 10, C ranges from about 1 to about 50, etc. As such, for example, in some embodiments, the ratio of B to C may range from about 4:1 to about 1:20. The oxidants in the composition may include one or more of halogens (e.g., fluorine, chlorine, bromine, iodine, astatine) and/or chalcogens (e.g., oxygen, sulfur, selenium, tellurium, polonium). For example, the oxidant in the composition may be selenous acid, and in such embodiments, selenous acid may be present in the composition in an amount ranging from about 0.01 g/L to about 1 g/L. As another example, the oxidant comprising one or more of halogens may be chloric acid or bromic acid. In some embodiments, the oxidants may be oxyacids (i.e., oxygen containing acids), exemplary embodiments of which have the empirical chemical formula $H_aR_bO_c$. In such embodiments, a in the chemical formula may assume the values 1, 2, 3 or 4; b may assume 1, 2 or 3; and c may assume the values 1, 2, 3, 4, 5, 6, 7 or 8. In other embodiments, the oxyacid may have chemical formula of $HRO_3$ or $H_2RO_3$. In these embodiments, i.e., in the embodiments where the oxyacid has one of the chemical formulae $H_aR_bO_c$, $HRO_3$ and $H_2RO_3$, R may comprise a halogen or a chalcogen. In some embodiments, the oxyacid may have a trigonal pyramidal molecular geometry. In some embodiments, one may form a dilute aqueous solution comprising water and any of the embodiments of the compositions disclosed herein. In such embodiments, the ratio of composition to water may be from about 1:4 to about 1:10.

In some embodiments, the compound included in the composition to treat semiconductor surfaces may comprise fluorine. Examples of such compounds are HF and $NH_4F$. In some embodiments, the compound comprising fluorine may comprise one or more of HF, hydrofluosilicic acid ($H_2SiF_6$), $NH_4F$, fluorotitanic acid ($H_2TiF_6$), barium fluoride (BaF), barium ferrite ($BF_4$), sodium fluoride (NaF), metal fluorides and non-metal fluorides. In some embodiments, the additives included in the composition to treat semiconductor surfaces may comprise ammonium hydroxide, HF, HCl, Hydrogen bromide (HBr), Hydrogen Iodide (HI), phosphoric acid ($H_3PO_4$) and ammonium hydroxide.

In some embodiments, the compositions described in the present invention may be used to treat surfaces of semiconductor devices, an exemplary embodiment of a semiconductor material being silicon. In some embodiments, one may also use an aqueous solution comprising the compositions and water to treat the semiconductor devices. Such semiconductor devices, when treated by either the compositions or the aqueous solution comprising the composition, may have a passivated oxide layer formed on their surfaces. Such oxide layers may have a wide range of thicknesses, ranging from about 40 Å to about 200 Å. The growth of passivated oxide layer may contribute to surface resistance (sheet rho($\rho$)) of the semiconductor device. For example, the contribution coming from being treated by a composition or an aqueous solution may increase the surface resistance by some amount, i.e., it may change the sheet rho by an amount $\Delta\rho$. In some embodiments, the sheet rho delta $\Delta\rho$ may range from about 3 $\Omega$/sq to about 20 $\Omega$/sq. In some embodiments, the change $\Delta\rho$ may be about 9 to about 15 $\Omega$/sq. And in yet some embodiments, sheet rho delta may be about 10 $\Omega$/sq. Changes in the surface resistance of a semiconductor device as consequences of passivated oxide layers forming on its surfaces from being treated by compositions or aqueous solutions described herein may lead to an increase in the total sheet rho of the semiconductor device. For example, the sheet rho of such semiconductor devices may range from about 50 $\Omega$/sq to about 120 $\Omega$/sq. In some embodiments, the sheet rho may be from about 60 $\Omega$/sq to about 90 $\Omega$/sq. Another consequence of the growth of passivated oxide layers may be a red shift in the location of the wavelength at which reflectance minimum takes place. For example, a composition treated semiconductor device with a passivated layer may have a reflectance minimum at a wavelength greater than a substantially similar semiconductor device which may not comprise a passivated layer. As an example, the red shift of a light incident on a surface of a composition treated semiconductor with passivated layer may range from about 20 nm to about 45 nm.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of growing an oxide layer on a semiconductor device, the method comprising the step of contacting at least one surface of a semiconductor device with the dilute aqueous solution comprising:
   (a) an oxidant, wherein the oxidant is $H_2SeO_3$;
   (b) a compound comprising fluorine;
   (c) one or more additives; and
   (d) water.

2. The method of claim 1, wherein the composition comprises A weight percent the oxidant, B weight percent of the compound comprising fluorine, C weight percent of the one or more additives, and D weight percent water, wherein the sum of A, B, C, and D is about 100.

3. The method of claim 2, wherein A is from about 0.01 weight percent to about 1 weight percent.

4. The method of claim 2, wherein B is from about 0.1 weight percent to about 10 weight percent.

5. The method of claim 2, wherein C is from about 1 weight percent to about 50 weight percent.

6. The method of claim 2, wherein the ratio of B to C is from about 4:1 to about 1:20.

7. The method of claim 1, wherein the compound comprising fluorine comprises one or more of HF, $H_2SiF_6$, $NH_4F$, $H_2TiF_6$, $BaF$, $BF_4$, $NaF$, metal fluorides and non-metal fluorides.

8. The method of claim 1, wherein the one or more additives comprise one or more of HF, HCl, HBr, HI, $H_3PO_4$, and $NH_4OH$.

9. The method of claim 1, wherein the oxidant is $H_2SeO_3$ which is present in an amount of from about 0.01 g/L to about 1 g/L.

10. A method of growing an oxide layer on a semiconductor device, the method comprising the step of contacting at least one surface of a semiconductor device with the dilute aqueous solution comprising:
    (a) an oxidant;
    (b) a compound comprising fluorine;
    (c) one or more additives; and
    (d) water,
    wherein the oxidant comprises one or more of fluorine, chlorine, or bromine.

11. The method of claim 10, wherein the oxidant is selected from chloric acid and bromic acid.

12. A semiconductor device comprising at least one passivation oxide layer, wherein the passivation oxide layer is formed by treating the semiconductor device with the composition of claim 1, wherein the passivation oxide layer has thickness of from about 40 Å to about 200 Å.

13. The semiconductor device of claim 12, wherein the semiconductor device exhibits a sheet rho after forming the passivation oxide layer of from about 50 to about 120 ohm/sq.

14. The semiconductor device of claim 12, wherein the semiconductor device exhibits a sheet rho delta after forming the passivation oxide layer of from about 3 to about 20 ohm/sq.

15. A semiconductor device comprising at least one passivation oxide layer, wherein the passivation oxide layer is formed by treating the semiconductor device with the composition of claim 10, wherein the passivation oxide layer has thickness of from about 40 Å to about 200 Å.

\* \* \* \* \*